US008933317B2

(12) United States Patent
Moczygemba et al.

(10) Patent No.: US 8,933,317 B2
(45) Date of Patent: Jan. 13, 2015

(54) THERMOELECTRIC REMOTE POWER SOURCE

(71) Applicants: Joshua E. Moczygemba, Wylie, TX (US); Overton L. Parish, IV, Frisco, TX (US); Ryan A. Turner, Dallas, TX (US); Pravesh Parmanand, Richardson, TX (US)

(72) Inventors: Joshua E. Moczygemba, Wylie, TX (US); Overton L. Parish, IV, Frisco, TX (US); Ryan A. Turner, Dallas, TX (US); Pravesh Parmanand, Richardson, TX (US)

(73) Assignee: Marlow Industries, Inc., Dallas, TX (US)

( * ) Notice: Subject to any disclaimer, the term of this patent is extended or adjusted under 35 U.S.C. 154(b) by 168 days.

(21) Appl. No.: 13/774,110

(22) Filed: Feb. 22, 2013

(65) Prior Publication Data

US 2013/0213448 A1   Aug. 22, 2013

Related U.S. Application Data

(60) Provisional application No. 61/601,963, filed on Feb. 22, 2012.

(51) Int. Cl.
*H01L 35/32* (2006.01)
*H01L 35/30* (2006.01)

(52) U.S. Cl.
CPC ............... *H01L 35/32* (2013.01); *H01L 35/30* (2013.01)
USPC ........... 136/230; 136/205; 136/208; 136/225; 136/232

(58) Field of Classification Search
USPC .......... 136/203, 205, 206, 208, 225, 230, 232
See application file for complete search history.

(56) References Cited

U.S. PATENT DOCUMENTS

| 1,242,499 | A | * | 10/1917 | Webb | 136/208 |
| 2,938,357 | A | | 5/1960 | Sheckler | 62/3 |
| 3,107,482 | A | | 10/1963 | Fonó | 60/6 |
| 4,374,406 | A | * | 2/1983 | Hepp | 362/253 |
| 6,996,976 | B2 | * | 2/2006 | Rumminger et al. | 60/295 |
| 2006/0179820 | A1 | * | 8/2006 | Sullivan | 60/275 |

FOREIGN PATENT DOCUMENTS

WO   WO 88/05964   8/1988   ........... H01L 35/30

* cited by examiner

*Primary Examiner* — Susan D Leong
(74) *Attorney, Agent, or Firm* — Baker Botts L.L.P.

(57) ABSTRACT

In one embodiment, a system includes a strap configured to be coupled to a container. The strap includes a plurality of plates arranged to allow the strap to flex. The system also includes a thermoelectric device coupled to the strap. The strap is configured to transfer heat between the thermoelectric device and the container. The system includes a thermal interface situated between the thermoelectric device and the strap.

20 Claims, 7 Drawing Sheets

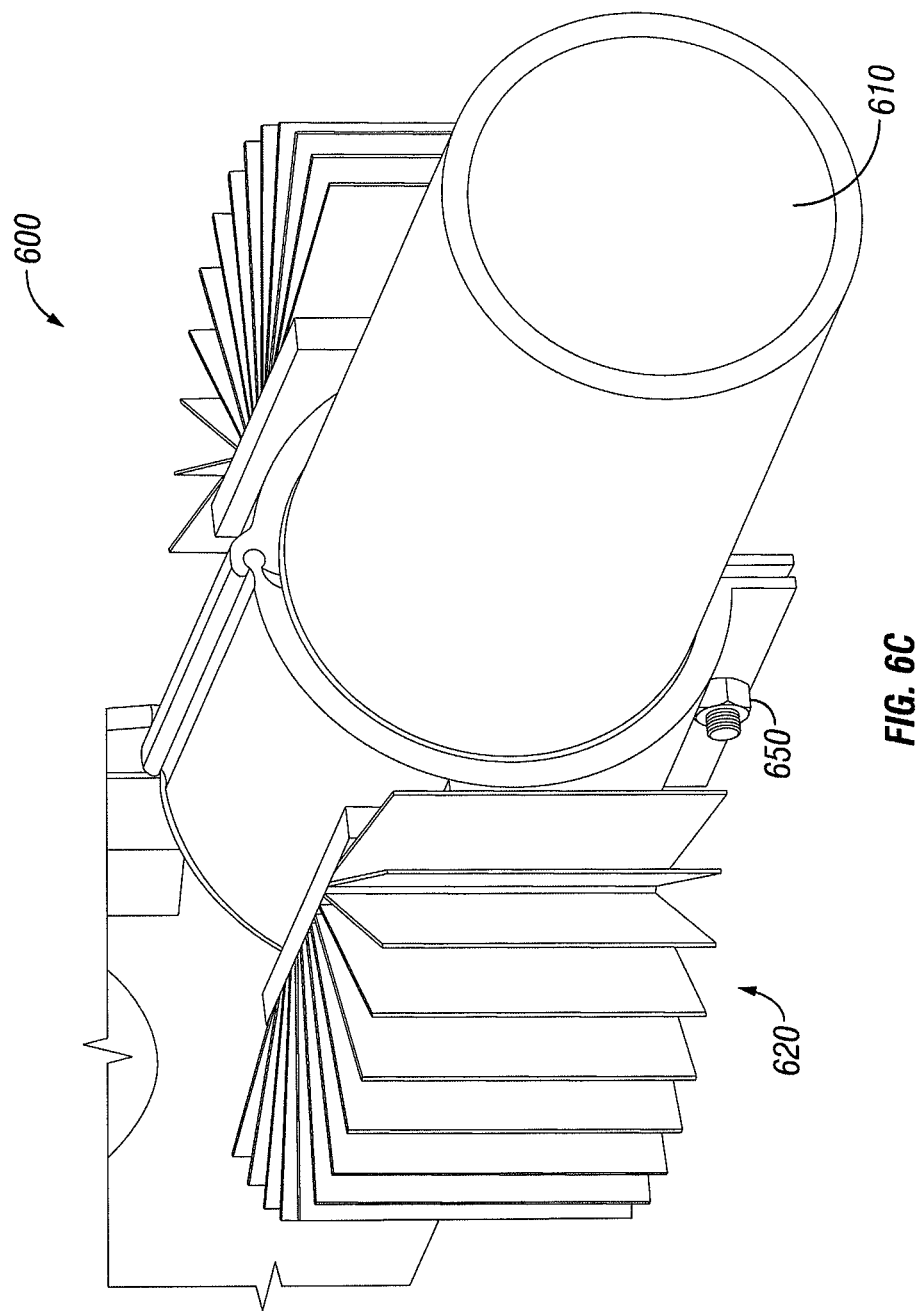

US 8,933,317 B2

THERMOELECTRIC REMOTE POWER SOURCE

RELATED APPLICATION

This application claims benefit under 35 U.S.C. §119(e) of U.S. Provisional Application Ser. No. 61/601,963, titled "Thermoelectric Remote Power Source,", filed Feb. 22, 2012, by Joshua E. Moczygemba, et al.

TECHNICAL FIELD

This disclosure relates generally to power sources and more particularly to a thermoelectric remote power source.

BACKGROUND

The basic theory and operation of thermoelectric devices has been developed for many years. Presently available thermoelectric devices used for cooling typically include an array of thermocouples that operate in accordance with the Peltier effect. Thermoelectric devices may also be used for heating, power generation and temperature sensing.

Thermoelectric devices may be described as essentially small heat pumps that follow the laws of thermodynamics in the same manner as mechanical heat pumps, refrigerators, or any other apparatus that is used to transfer heat energy. A principal difference is that thermoelectric devices function with solid state electrical components (thermoelectric elements or thermocouples) as compared to more traditional mechanical/fluid heating and cooling components.

Certain locations may not have access to electrical power grids, but may include heat differentials. Current power generation techniques in such locations are ineffective. Some require modification of structures (e.g., pipes carrying a hot or cool medium) in order to generate power.

SUMMARY

In one embodiment, a system includes a strap configured to be coupled to a container. The strap includes a plurality of plates arranged to allow the strap to flex. The system also includes a thermoelectric device coupled to the strap. The strap is configured to transfer heat between the thermoelectric device and the container. The system includes a thermal interface situated between the thermoelectric device and the strap.

In some embodiments, the system may include a material configured to substantially seal the thermoelectric device within the strap. The strap may be anodized. A cover may be arranged over the strap. The strap may be configured to be held in compression against the wall of the pipe container.

In one embodiment, a method includes attaching a strap to a container. The strap includes a plurality of plates arranged to allow the strap to flex. The method includes attaching a thermoelectric device to the strap. The strap is configured to transfer heat between the thermoelectric device and the container. The method also includes placing a thermal interface between the thermoelectric device and the strap.

Depending on the specific features implemented, particular embodiments may exhibit some, none, or all of the following technical advantages. Thermoelectric devices may operate efficiently by being secured to a container such that thermal transfer between the thermoelectric device and the container is facilitated. Electrical components associated with the thermoelectric device can be kept at a suitable temperature. Other technical advantages will be readily apparent to one skilled in the art from the following figures, description and claims.

BRIEF DESCRIPTION OF THE DRAWINGS

Reference is now made to the following description taken in conjunction with the accompanying drawings, wherein like reference numbers represent like parts and which:

FIGS. 6A-6C illustrates one embodiment of a system that uses a hinged joint mechanism.

DETAILED DESCRIPTION

Figure 1:
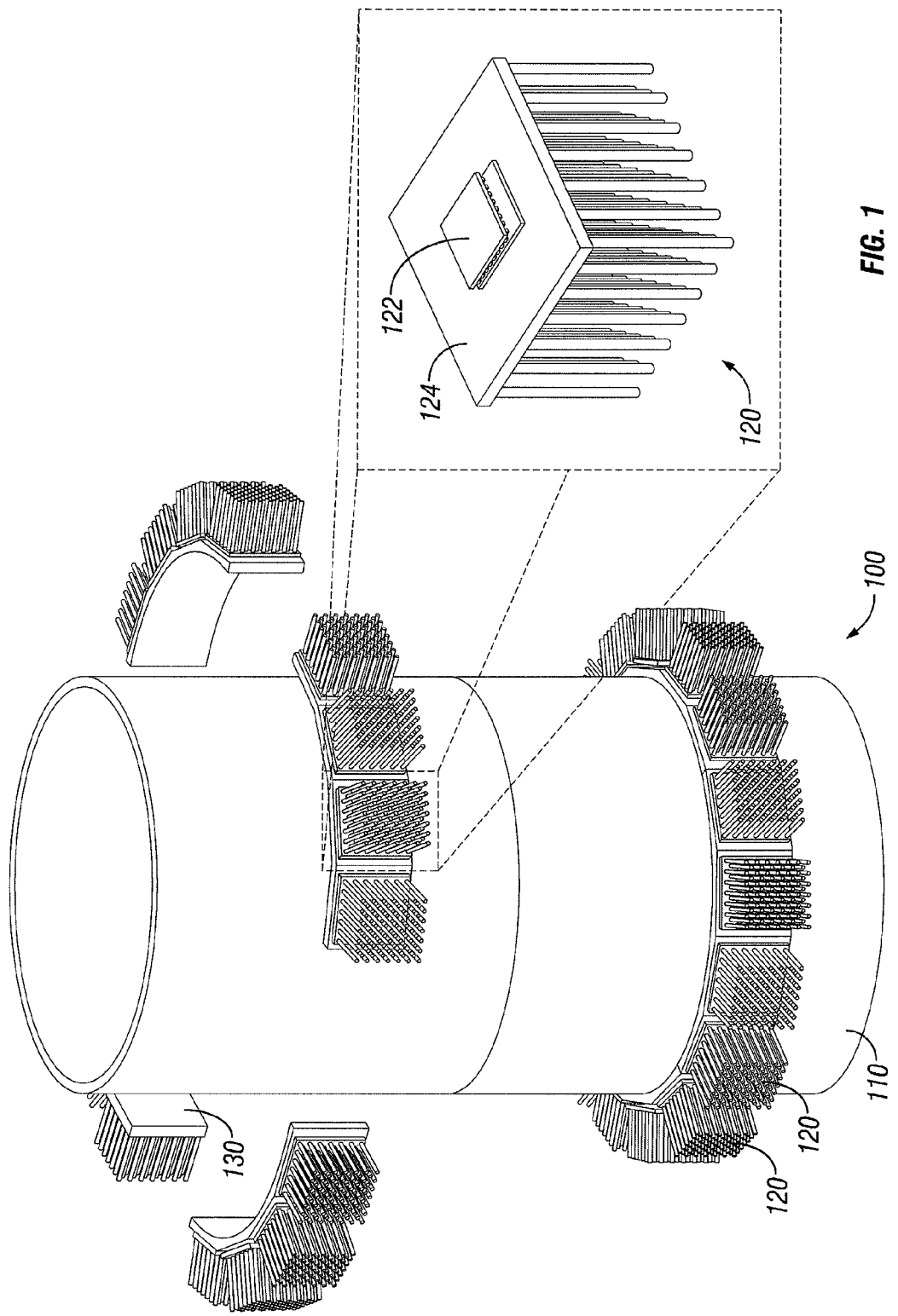
FIG. 1 illustrates one embodiment of a system for generating power.

FIG. 1 illustrates one embodiment of system 100 for generating power. System 100 includes pipe 110 and multiple thermoelectric modules 120 thermally coupled to pipe 110 using strap 130. Each thermoelectric module 120 includes thermoelectric device 122 coupled to sink 124. In operation, a medium (e.g., liquid or gas) may flow through pipe 110 and may be at a temperature that is different than the environment surrounding pipe 110. Thermoelectric modules 120 may convert the temperature difference between the medium in pipe 110 and the surrounding environment into electrical power according to the Seebeck effect. System 100 may include any suitable number of pipes 110 as well as any suitable number of straps 130 on each pipe 110. Each strap 130 may include any suitable number of thermoelectric modules 120. The number of straps 130 and/or thermoelectric modules 120 used in system 100 may be determined based on power requirements of the application(s) using the electrical power generated by thermoelectric modules 120. For example, if an application requires 40 W of power, and the output power of one thermoelectric module 120 is 1 W, then at least 40 thermoelectric modules 120 may be utilized. Multiple straps 130 may be placed on pipe 110 and each of them can include one or more thermoelectric modules 120.

In some embodiments, system 100 may be useful in various operations, such as power generation operations (as discussed above) or in heating and/or cooling applications. For example, pipe 110 may represent a container of material (e.g., gasoline or fuel) that should be kept within a certain temperature range. A controller may be configured to send electrical signals to thermoelectric modules 120 to cause the side of thermoelectric modules 120 that interface with strap 130 to become hot or cold. In such a configuration, thermoelectric modules 120 may serve to lower or raise the temperature of the material within the container as desired. The transfer of heat is facilitated by strap 130. The controller may receive signals indicating the temperature of the material in the container (depicted as pipe 110) and adjust the temperature using thermoelectric modules 120 coupled to strap 130 by sending appropriate signals to thermoelectric modules 120 that cause the sides of thermoelectric modules 120 to become hot or cold.

Pipe 110 is an example of a container; various containers may be used in system 100 in place of pipe 110. In some embodiments, pipe 110 is configured to store a material or medium that has a temperature that is different than the environment surrounding pipe 110. As examples, pipe 110 can store hot solids, hot fluids, hot gasses, cold solids, cold fluids, and cold gasses. Pipe 110 may be an exhaust pipe. While depicted as cylindrical in shape, pipe 110 may be in any suitable shape or configuration. As an example, pipe 110 may be between 10 and 20 inches in diameter. Pipe 110 may be situated in any suitable medium including without limitation a vacuum (e.g., in a fuel line), open air, sea water, fresh water, or oil. Pipe 110 may be situated in a high pressure environment (e.g., deep sea water). Pipe 110 may be a storage container.

In some embodiments, thermoelectric modules 120 may be configured for optimum or near optimum performance. For example, thermoelectric device 122 may be thermally matched to sink 124. This may aid in optimizing the electrical power generation of thermoelectric module 120. As another example, an individual thermoelectric module 120 may be impedance matched with a node it is electrically coupled to (e.g., another thermoelectric module 120 or an electrical circuit). This may aid in optimizing the transfer of electrical power generated by thermoelectric modules 120. Sink 124 may be a heat sink or a cold sink. Sink 124 may be anodized in some embodiments. Anodization may decrease corrosion of sink 124 and facilitate thermal radiation. For example, when sink 124 is a heat sink, sink 124 may be anodized with black aluminum in order to increase heat radiation out from thermoelectric device 122. In some embodiments, suitable sealing techniques may be used to protect thermoelectric module 120 from environmental exposure (e.g., exposure to rain, snow, ice, dirt, and/or other debris). For example, a silicon O-ring may be placed around thermoelectric module 120 such that thermoelectric module 120 is held in compression in strap 130. As another example, the perimeter of thermoelectric module 120 may be sealed using a sealant. The sealant may be capable of withstanding high temperatures (e.g., over 100 degrees Celsius). For example, the sealant may be implemented using room temperature vulcanization (RTV) silicone. Using sealing techniques may reduce heat loss and/or increase power output of system 100.

In some embodiments, strap 130 may be configured in any suitable shape in order to thermally couple thermoelectric module 120 to pipe 110. Strap 130 may be formed of a continuous piece of material or be formed by linking together individual (or groups of) plates that are configured to receive thermoelectric modules 120. For example, FIG. 1 illustrates strap 130 comprising four pieces that may be clamped around pipe 110. In some embodiments, the side of strap 130 configured to interface with thermoelectric module 120 may be substantially flat while the side of strap 130 configured to interface with pipe 110 may be curved. This may allow for better mating between strap 130 and pipe 110 as well as thermoelectric module 120; this can lead to increased performance. As an example, one or more plates that form strap 130 may have a substantially flat side and a curved side.

In some embodiments, spring loaded bolts (e.g., 8-32 stainless steel bolts), or other suitable components, may be used to connect each of the four pieces and to ensure that each of the four pieces is held in suitable compression against the wall of pipe 110. As an example, Belleville spring washers are used in bolt joints of strap 130 to maintain compression of strap 130 against pipe 110 in the event of expansion or contraction of pipe 110 or strap 130 due to changes in temperature. Such configurations may be advantageous because it they may allow strap 130 to be attached to pipe 110 without modification of pipe 110. Non-setting, high temperature thermal mastic (or other suitable material) may be employed in gaps between the strap 130 and pipe 110 to facilitate heat transfer from pipe 110 to thermoelectric modules 120. The material employed in such gaps may be non-setting to maintain good thermal contact in the event of expansion and contraction due to temperature changes in pipe 110. The material may also be compatible with changing environmental conditions (e.g., freezing temperatures, snow, rain, and sunlight). As an example, the material may be CHEMAX CORPORATION high temperature TRACIT-1100 thermal mastic.

In some embodiments, strap 130 may be configured to facilitate electric coupling of thermoelectric modules 120. For example, strap 130 may include leads or areas where leads may be placed so that thermoelectric modules 120 may be electrically coupled in series, in parallel, or any suitable combination of series and parallel configurations for voltage and power output of various applications. In some embodiments, strap 130 may be anodized (e.g., using aluminum). Anodization may decrease corrosion of strap 130 as well as facilitate heat radiation. For example, strap 130 may be anodized using a clear material to reduce radiative loss of heat.

In some embodiments, a cover (e.g., a shroud) may be placed around pipe 110 covering strap 130. As an example, the purpose of such a covering would be to re-direct wind currents to flow across thermoelectric modules 120 in order to increase efficiency and maximize system power output. As another example, such a covering may provide thermoelectric modules 120 with shading from the sun, protection from unwanted or unexpected mechanical impacts, and protection from debris or weather (e.g., rain, sleet, or snow).

The following table provides examples of the amount of power that may be generated using system 100 given various approximate temperatures of pipe 110 and approximate values of ambient factors:

| Ambient Temperature (° C.) | Ambient Wind (MPH) | Pipe Temperature (° C.) | Generated Power (W) |
| --- | --- | --- | --- |
| 0 | 0 | 100 | 2-3 |
| 0 | 0 | 120 | 4-5 |
| 30 | 0 | 100 | 1.5-2 |
| 30 | 3.7 | 100 | 2-2.5 |
| 30 | 0 | 120 | 2.5-3 |
| 30 | 3.7 | 120 | 3.5-4 |
| 40 | 0 | 100 | 1-1.5 |
| 40 | 6.5 | 100 | 1.8-2.2 |
| 40 | 0 | 120 | 1.8-2.2 |
| 40 | 6.5 | 120 | 2.8-3.2 |

Figure 2:
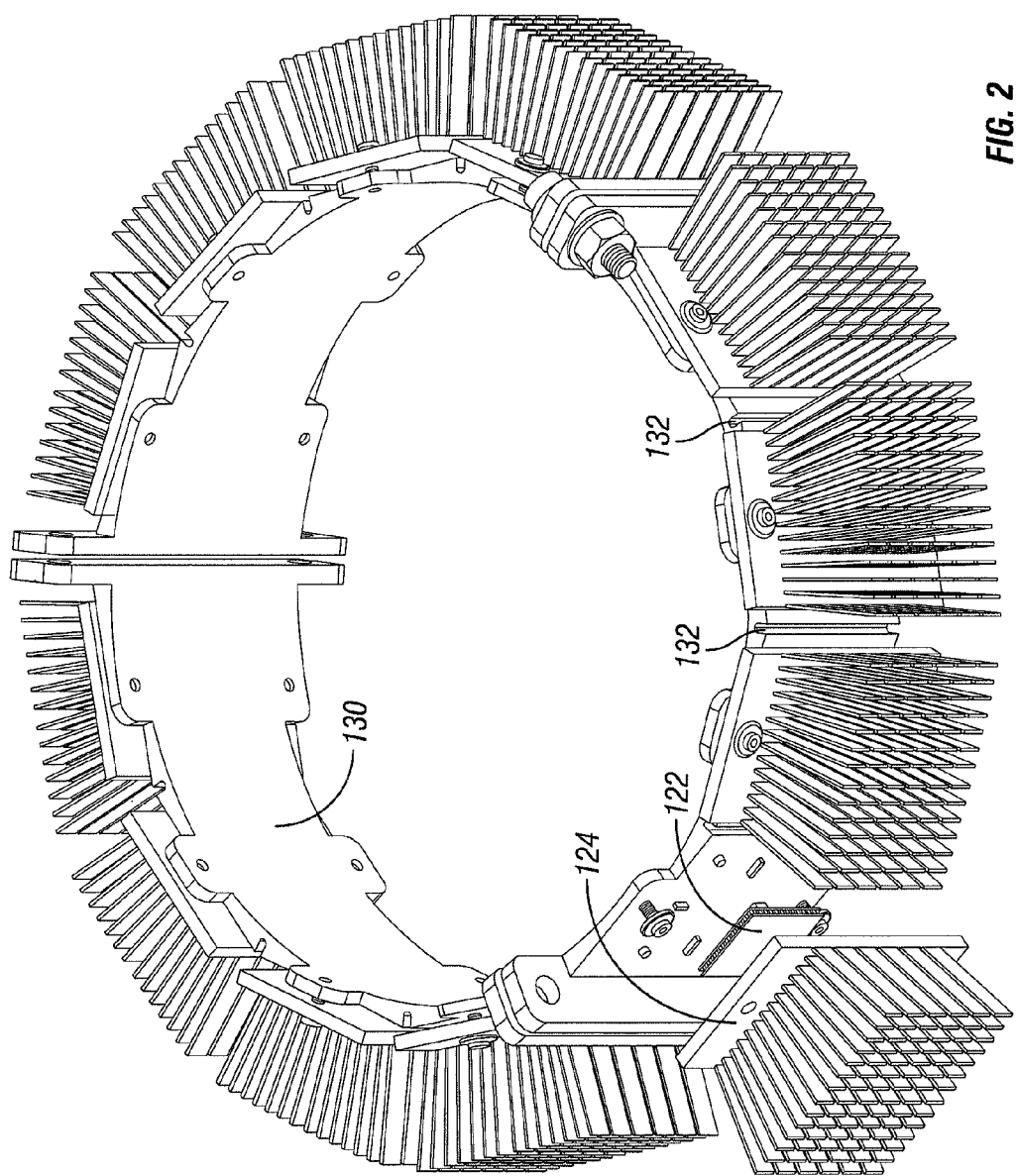
FIG. 2 illustrates one embodiment of a strap used in the system of FIG. 1.

FIG. 2 illustrates one embodiment of the configuration of strap 130. FIG. 2 illustrates one manner in which thermoelectric device 122 may be attached to strap 130 and how sink 124 may be attached to strap 130. Strap 130 includes notches 132. Notches 132 may allow strap 130 to conform to pipe 110 without causing bending in flat regions of strap 130 that interface with thermoelectric devices 122. In some embodiments, pipe 110 may not be uniform which may cause bending in strap 130 were it not for notches 132. Such bending may increase the thermal interface resistance in system 100 resulting in reduced power output from thermoelectric devices 122. In some embodiments, notches 132 may allow strap 130 to flex. This may allow strap 130 to better conform to pipe 110. For example, pipe 110 may expand or contract depending on its content; notches 132 may allow strap 130 to flex with the changes in pipe 110 so as to benefit performance. As another example, pipe 110 may include non-uniformities in its shape;

notches 132 may allow strap 130 to flex so that strap 130 maintains good contact with pipe 110 in areas that include non-uniformities.

Figure 3A:
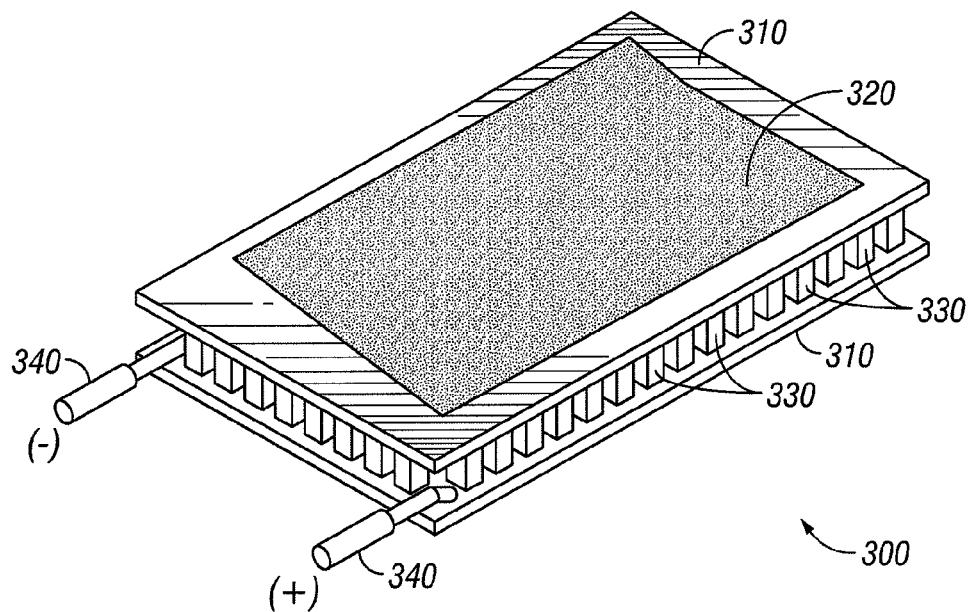
FIGS. 3A-3B illustrate embodiments of a thermoelectric device suitable for use in the system of FIG. 1.
Figure 3B:
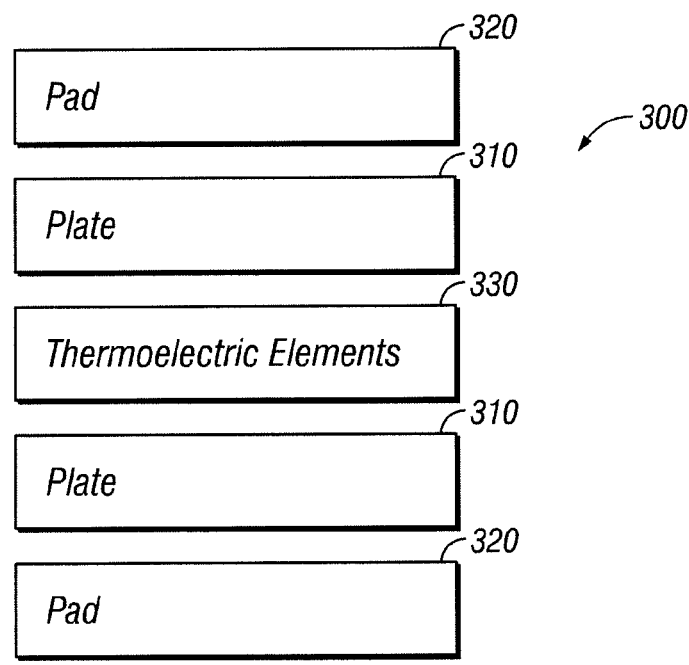

FIGS. 3A-3B illustrate embodiments of thermoelectric device 300 suitable for use in system 100 of FIG. 1. For example the examples discussed below regarding thermoelectric device 300 may be used to implement thermoelectric device 122 of FIG. 1. Thermoelectric device 300 includes a plurality of thermoelectric elements 330 disposed between plates 310. Electrical terminals 340 are provided to allow thermoelectric device 300 to be electrically coupled with to one or more devices that use, transform, or store power. Thermoelectric device 300 also includes thermal interface 320 coupled to one or more of pates 310. FIG. 3B illustrates a configuration of plates 310, thermal interface 320, and thermoelectric elements 330 of thermoelectric device 300.

In some embodiments, thermoelectric elements 330 fabricated from dissimilar semiconductor materials such as N-type thermoelectric elements and P-type thermoelectric elements. Thermoelectric elements 330 are typically configured in a generally alternating N-type element to P-type element arrangement and typically include an air gap disposed between adjacent N-type and P-type elements. In many thermoelectric devices, thermoelectric materials with dissimilar characteristics are connected electrically in series and thermally in parallel.

Examples of thermoelectric devices and methods of fabrication are shown in U.S. Pat. No. 5,064,476 titled Thermoelectric Cooler and Fabrication Method; U.S. Pat. No. 5,171,372 titled Thermoelectric Cooler and Fabrication Method; and U.S. Pat. No. 5,576,512 titled Thermoelectric Apparatus for Use With Multiple Power Sources and Method of Operation.

N-type semiconductor materials generally have more electrons than would be found in the associated ideal crystal lattice structure. P-type semiconductor materials generally have fewer electrons than would be found in the associated ideal crystal lattice structure. The "missing electrons" are sometimes referred to as "holes." The extra electrons and extra holes are sometimes referred to as "carriers." The extra electrons in N-type semiconductor materials and the extra holes in P-type semiconductor materials are the agents or carriers that transport or move heat energy between plates 310 through thermoelectric elements 330 when subject to a DC voltage potential. These same agents or carriers may generate electrical power when an appropriate temperature difference is present between plates 310. Terminals 340 may be coupled to one of plates 310 in a manner that withstands high temperature environments, such as resistance welding, tungsten inert gas (TIG) welding, and laser welding.

In some embodiments, thermoelectric elements 330 may include high temperature thermoelectric material. Examples of high temperature thermoelectric materials include lead telluride (PbTe), lead germanium telluride (PbxGel-xTe), TAGS alloys (such as (GeTe)0.85(AgSbTe2)0.15), bismuth telluride (Bi2Te3) based alloys, and skutterudites.

In some embodiments, thermoelectric elements 330 may include a diffusion barrier that includes refractory metals (e.g., a metal with a melting point above 1,850° C.). Suitable refractory metals may include those that are metallurgically compatible with high temperature thermoelectric materials and metallurgically compatible with other components of thermoelectric device 300. For example, a molybdenum diffusion barrier may be used. This may be advantageous in that molybdenum may be metallurgically compatible with various aspects of thermoelectric device 300. For example, as further discussed below, thermoelectric device 300 may include an aluminum braze that is metallurgically compatible with a molybdenum diffusion barrier. Such a diffusion barrier may prevent or reduce the chance or occurrence of Kirkendall voiding in thermoelectric device 300. Other suitable examples of diffusion barrier materials that could have similar properties to molybdenum include tungsten and titanium.

In some embodiments, alternating thermoelectric elements 330 of N-type and P-type semiconductor materials may have their ends connected by electrical conductors. Conductors may be metallizations formed on thermoelectric elements 330 and/or on the interior surfaces of plates 310. Conductors may include aluminum. Ceramic materials may be included in plates 310 which define in part the cold side and hot side, respectively, of thermoelectric device 300. In some embodiments, the ceramic materials may provide electrical isolation from hot and cold side sources. Aluminum metallized ceramics may accommodate thermal stresses (i.e., due to high temperature exposure) of the ceramic/aluminum bond. Examples of suitable ceramic materials include anodized aluminum, aluminum oxide, aluminum nitride, and beryllium oxide.

In some embodiments, thermoelectric elements 330 may be coupled to plates 310 using a medium. The Medium may include brazes and/or solders. For example, aluminum-based brazes and/or solders may be used, such as aluminum-silicon (Al—Si) braze family and/or zinc-aluminum (Zn—Al) solder. In some embodiments, using such brazes and/or solders may provide for high temperature operation and allow for flexible joints. Kirkendall voiding may be prevented or reduced.

In some embodiments, thermal interface 320 may be any material suitable for facilitating thermal conduct. For example, thermal interface 320 may be implemented using a graphite pad (e.g., a GRAFOIL thermal pad). Such a pad may be thick enough to accommodate minor variation in surface flatness (e.g., of pipe 110 of FIG. 1 or of plate 310), but thin enough not to detrimentally affect performance of thermoelectric device 300. Thermal interface 320 may be used to reduce thermal resistance at interfaces of thermoelectric device 300 (e.g., hot and cold interfaces). Other examples of how thermal interface 320 may be implemented include thermal paste, solder, epoxy, thermal mastic, and metal foils (e.g., indium foil).

In some embodiments, using one or more of the configurations discussed above, thermoelectric device 300 may be suitable as a fixed-joint, high temperature thermoelectric generator that is capable of being used in high temperature applications. For example, a thermoelectric generator built using skutterudite thermoelectric elements that include molybdenum diffusion barriers, conductors formed by aluminum metallizations, and aluminum based brazes may result in a device that can operate with at least one of its plates (such as plate 310) in an ambient temperature greater than 500 degrees Celsius. As another example, a thermoelectric generator built using bismuth telluride thermoelectric elements that include a molybdenum diffusion barrier, conductors formed by aluminum metallizations, and zinc-aluminum (ZnAl) solder may result in a device that can operate with at least one of its plates (such as plate 206 or plate 208) at an ambient temperature greater than 300 degrees Celsius.

As another example, a thermoelectric generator built using bismuth telluride thermoelectric elements that include a nickel diffusion barrier, conductors formed by copper metallizations, and lead-based solder may result in a device that can operate with at least one of its plates (such as plate 206 or plate 208).

Figure 4:
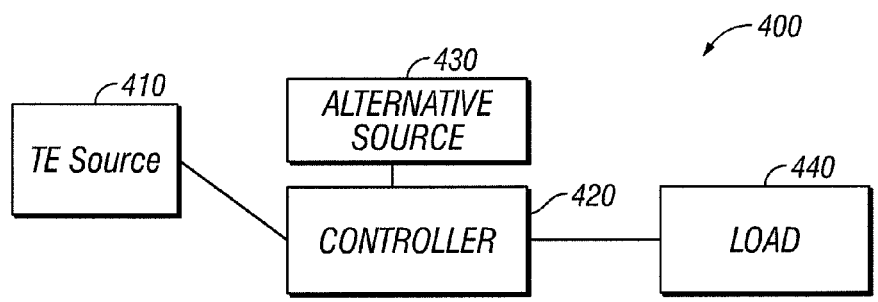
FIG. 4 illustrates one embodiment of a system for generating power using multiple power sources.

FIG. 4 illustrates one embodiment of system 400 for generating power using multiple power sources. System 400 includes thermoelectric energy source 410, controller 420, alternative energy source 430, and load 440. System 400 is an example of how energy generated using system 100 of FIG. 1 may be used. Controller 420 may use energy from thermoelectric energy source 210 and/or alternative energy source 430 to provide power to load 440.

In some embodiments, thermoelectric energy source 410 may be implemented using system 100 of FIG. 1. Alternative energy source 430 may be a renewable energy source, such as one or more of solar energy, wind energy, kinetic energy, hydroelectric energy or other suitable energy sources. Thermoelectric energy source 410 can be used in conjunction with alternative energy source 430 to provide consistent power in various conditions (e.g., day time, night time, various seasons). For example, thermoelectric energy source 410 may function better in cooler weather and at night while alternative energy source 430 (e.g., solar energy source) may function better in direct sunlight and during the summer months. The energy sources may complement each other.

In some embodiments, controller 430 may include any suitable combination of components (e.g., circuits and transformers). For example, due to changing conditions (e.g., ambient temperatures, ambient winds, temperatures of components of system 100 of FIG. 1), power output from thermoelectric energy source 410 and alternative energy source 430 may fluctuate over time. To mitigate electrical variation, controller 420 may transform power input from one or more of thermoelectric energy source 410 and alternative energy source 430 into a steady voltage output to load 440. Controller 420 may also allow for dynamic load matching of load 440 to one or more of thermoelectric energy source 410 and alternative energy source 430. This may facilitate increased power output of one or more of thermoelectric energy source 410 and alternative energy source 430 over varying operating conditions.

In some embodiments, load 440 may be one or more systems that use electrical power. Examples of load 440 may be lighting systems, communication systems, measuring systems, sensors, and other suitable systems.

Figure 5:
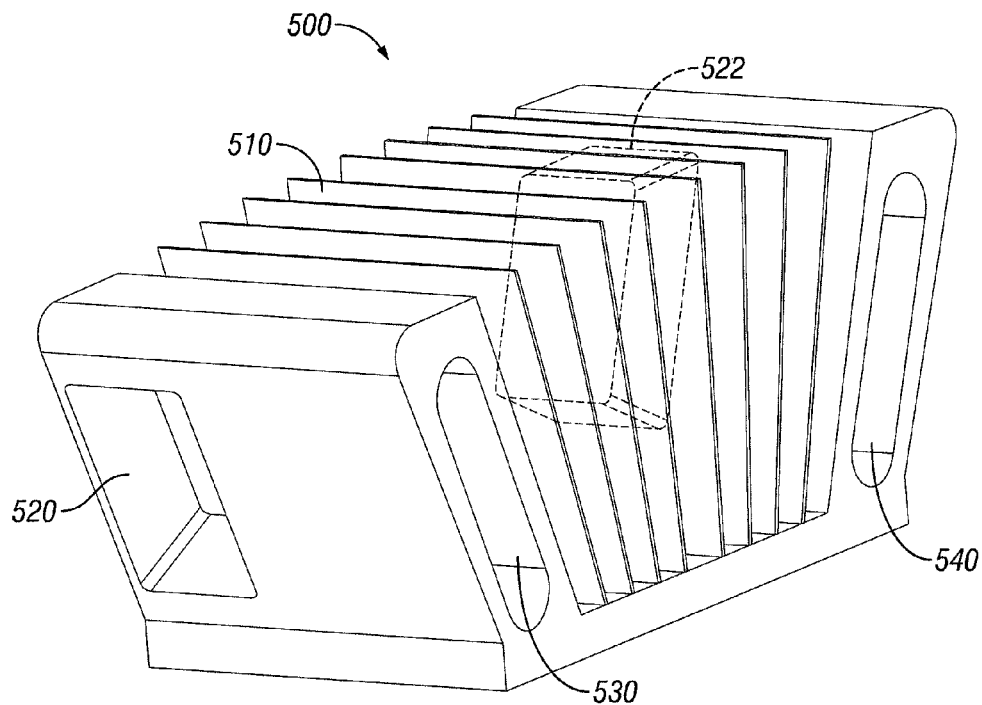
FIG. 5 illustrates one embodiment of a sink that is configured to store items.

FIG. 5 illustrates one embodiment of sink 500 that is configured to store items. Sink 500 includes fins 510 as well as recesses 520 and 522 and compartments 530 and 540. Recesses 520 and 522 and compartments 530 and 540 may store items such as electronics, batteries, or other items suitable for the application in which sink 500 is used. In some embodiments, sink 124 of FIGS. 1 and 2 may be implemented using sink 500. One or more aspects of sink 500 (e.g., fins 510) may be implemented, in some embodiments, using the techniques and materials discussed above with respect to sink 124.

In some embodiments, items in recesses 520 and 522 as well as compartments 530 and 540 benefit from heat being radiated by sink 500. For example, in a cold environment, items such as electronics, printed circuit boards, and batteries may operate better in the presence of the heat being radiated by sink 500 than out of its presence. As an example, one or more batteries and associated charging circuitry may be stored in one or more of recesses 520 and 522 and compartments 530 and 540 that may store energy produced by thermoelectric devices configured as discussed above with respect to system 100 of FIG. 1.

Figure 6A:
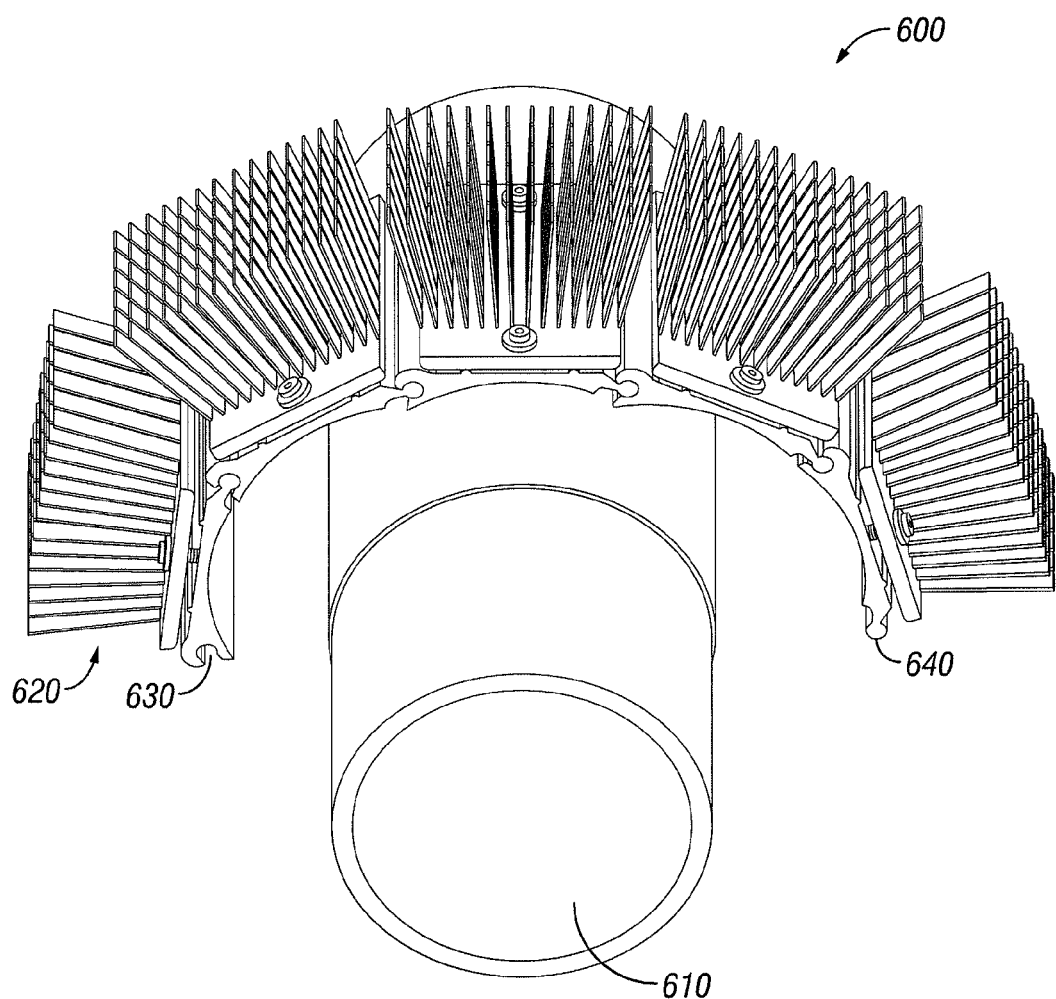
Figure 6B:
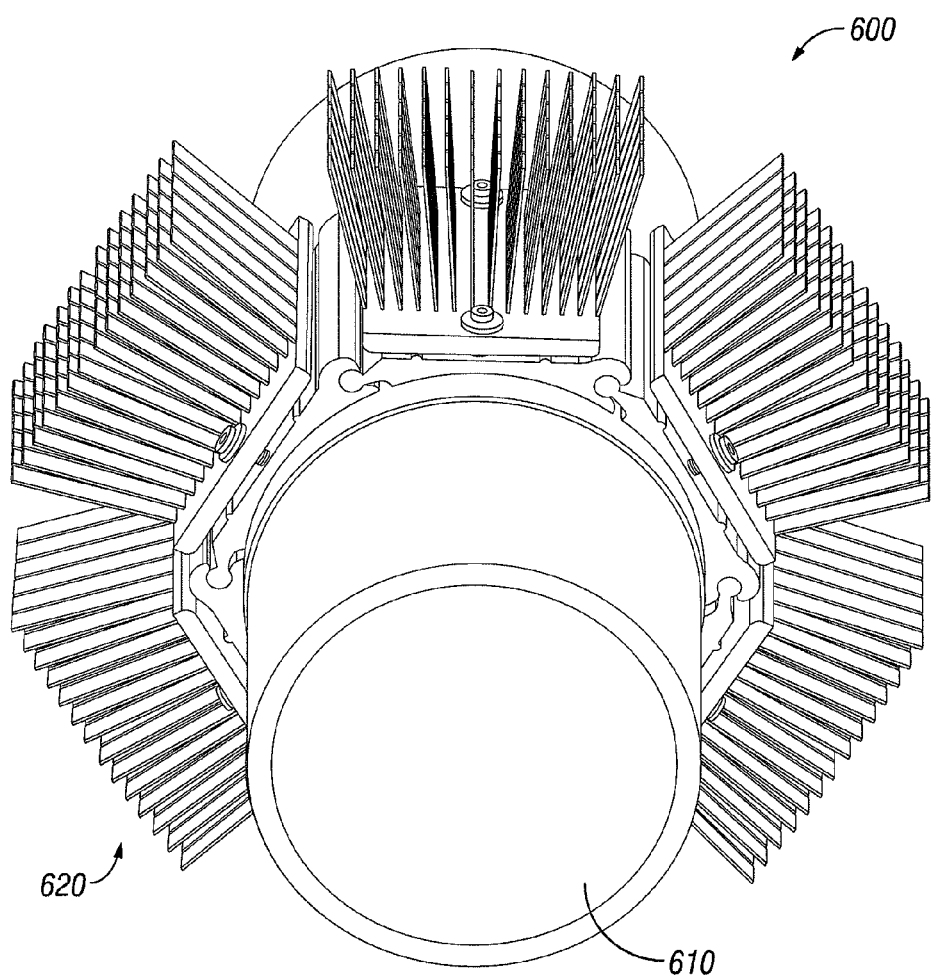

FIGS. 6A-6C illustrate one embodiment of system 600 that uses a hinged joint mechanism. System 600 includes pipe 610 around which strap 620 is placed. Strap 620 includes thermoelectric devices coupled to sinks. Strap 620 includes hinged joints that are formed from joint opening 630 and joint formation 640. Joint opening 630 and joint formation 640 are configured such that joint formation 640 can be mated with joint opening 630. While a particular hinged joint mechanism is illustrated in the embodiment depicted in FIGS. 6A-6C, other suitable hinged joint mechanisms may be used (e.g., a pin-based hinged configuration, a piano hinged configuration, chain-based hinge, a elastomeric hinge, or tie-down straps). Fastener 650 (e.g., bolts, screws, adhesives, clamps, or other suitable fastening mechanisms) may be used in strap 620 to secure strap 620 to pipe 610. In some embodiments, the use of a hinged joint mechanism may allow for strap 620 to be more conformed to pipe 610. For example, pipe 610 may include non-uniformities (e.g., bulges and depressions) and the use of the hinged joint mechanism may allow for strap 620 to better conform to pipe 610. The use of the hinged joint mechanism in system 600 may also facilitate deployment by allowing strap 620 to be affixed to pipe 610 efficiently.

In some embodiments, the hinged joint mechanism may allow strap 620 to flex. This may allow strap 620 to better conform to pipe 610. For example, pipe 610 may expand or contract depending on its content; hinged joints may allow strap 620 to flex with the changes in pipe 610 so as to benefit performance. As another example, pipe 610 may include non-uniformities in its shape; hinged joints may allow strap 620 to flex so that strap 620 maintains good contact with pipe 610 in areas that include non-uniformities.

In operation, a medium (e.g., liquid or gas) may flow through pipe 610 and may be at a temperature that is different than the environment surrounding pipe 610. The thermoelectric devices on strap 620 may convert the temperature difference between the medium in pipe 610 and the surrounding environment into electrical power according to the Seebeck effect. In some embodiments, one or more aspects of system 600 may be implemented using one or more techniques discussed above with respect to system 100 of FIG. 1. As examples, one or more aspects of pipe 610 and strap 620 (including the thermoelectric devices on strap 620) may be implemented using one or more aspects of pipe 110, strap 130, and thermoelectric module 120 of FIG. 1.

Depending on the specific features implemented, particular embodiments may exhibit some, none, or all of the following technical advantages. System 100 may allow for a substantial amount of power to be generated (e.g., watts of power). Heat pipes may not be necessary in order to provide power in system 100. System 100 may not necessitate changes to pipe 110 in order to generate power using pipe 110. System 400 may integrate multiple power sources (e.g., power generated from thermoelectric devices and power generated from the sun) to provide power for various applications. Other technical advantages will be readily apparent to one skilled in the art from the preceding figures and description as well as the proceeding claims. Particular embodiments may provide or include all the advantages disclosed, particular embodiments may provide or include only some of the advantages disclosed, and particular embodiments may provide none of the advantages disclosed.

Although several embodiments have been illustrated and described in detail, it will be recognized that modifications and substitutions are possible without departing from the spirit and scope of the appended claims.

What is claimed is:

1. A system comprising:
a strap configured to be coupled to a container, the strap comprising a plurality of plates arranged to allow the strap to flex;
a thermoelectric device coupled to the strap, the strap configured to transfer heat between the thermoelectric device and the container; and a thermal interface situated between the thermoelectric device and the strap.

2. The system of claim 1, further comprising a material configured to substantially seal the thermoelectric device within the strap.

3. The system of claim 1, wherein the strap is anodized.

4. The system of claim 1, further comprising a cover arranged over the strap.

5. The system of claim 1, wherein the strap is configured to be held in compression against the container.

6. The system of claim 1, further comprising non-setting material placed between the container and the strap.

7. The system of claim 1, further comprising a heat sink coupled to the thermoelectric device, the heat sink substantially thermally matched to the thermoelectric device.

8. The system of claim 7, wherein the heat sink comprises a compartment.

9. The system of claim 1, wherein the strap comprises a hinged joint.

10. The system of claim 1, wherein the strap comprises notches.

11. A method comprising:
   attaching a strap to a container, the strap comprising a plurality of plates arranged to allow the strap to flex;
   attaching a thermoelectric device to the strap, the strap configured to transfer heat between the thermoelectric device and the container; and
   placing a thermal interface between the thermoelectric device and the strap.

12. The method of claim 11, further comprising substantially sealing the thermoelectric device within the strap.

13. The method of claim 11, wherein the strap is anodized.

14. The method of claim 11, further comprising arranging a cover over the strap.

15. The method of claim 11, configuring the strap to be held in compression against the container.

16. The method of claim 11, further comprising placing non-setting material between the container and the strap.

17. The method of claim 11, further comprising coupling heat sink to the thermoelectric device, the heat sink substantially thermally matched to the thermoelectric device.

18. The method of claim 17, wherein the heat sink comprises a compartment.

19. The method of claim 11, wherein the strap comprises a hinged joint.

20. The method of claim 11, wherein the strap comprises notches.

* * * * *